United States Patent

Yasuda et al.

Patent Number: 5,471,278
Date of Patent: Nov. 28, 1995

[54] CADMIUM/RARE GAS DISCHARGE LAMP OF THE SHORT ARC TYPE, AS WELL AS PROJECTION EXPOSURE DEVICE USING THE SAME

[75] Inventors: Yukio Yasuda; Akiyasu Yamaguchi; Tatsushi Igarashi; Yasuo Oonishi; Kenzo Kai; Masanori Sugihara, all of Himeji; Takashi Mori, Kawasaki; Akira Miyaji, Tokyo, all of Japan

[73] Assignees: Ushiodenki Kabushiki Kaisha; Kabushiki Kaisha Nikon, both of Tokyo, Japan

[21] Appl. No.: 154,404

[22] Filed: Nov. 19, 1993

[30] Foreign Application Priority Data

Nov. 20, 1992 [JP] Japan .................. 4-333765
Oct. 22, 1993 [JP] Japan .......... 5-286219 JP

[51] Int. Cl.6 ........................ H01J 61/18
[52] U.S. Cl. .............. 355/67; 355/71; 313/638; 313/571; 313/606
[58] Field of Search ................ 313/571, 573, 313/574, 606, 620, 635, 638, 643, 44; 355/53, 67, 69, 71

[56] References Cited

U.S. PATENT DOCUMENTS

| | | | |
|---|---|---|---|
| 4,387,319 | 6/1983 | White et al. | 313/620 |
| 4,701,664 | 10/1987 | Larue et al. | 313/635 X |
| 4,704,346 | 11/1987 | Hiramoto et al. | 313/571 X |
| 4,988,918 | 1/1991 | Mori et al. | 313/620 X |
| 5,264,898 | 11/1993 | Kamon et al. | 355/67 |
| 5,287,142 | 2/1994 | Kamon | 355/53 |

FOREIGN PATENT DOCUMENTS 55-10757  1/1980  Japan.

Primary Examiner—Russell E. Adams
Assistant Examiner—D. P. Malley
Attorney, Agent, or Firm—Keck, Mahin & Cate

[57] ABSTRACT

A cadmium/inert gas discharge lamp of the short arc type, which suppresses an unnecessary emission upstream and downstream of the necessary emission spectra in a wavelength range of 210 to 230 nm, achieves a high efficiency of the emission spectra in the range 210 to 230 nm and can be used in very satisfactory manner for industrial applications. Also, a highly efficient projection exposure device through the incorporation of a cadmium/rare gas discharge lamp of the short arc type having good emission spectrum characteristics in the wavelength range 210 to 230 nm, which can transmit in projecting manner fine image patterns with a large depth of focus. The cadmium/rare gas discharge lamp of the short arc type is arranged within a temperature-regulated quartz bulb, and is provided with a pair of adjacently facing electrodes, together with inert gas selected from xenon, krypton, argon, neon or mixtures of them. Metal cadmium with a pressure of 14 to 200 kPa is encapsulated in the tube in a stationary lighting operation. The lamp is operated in such a way that J/P, i.e. the ratio between a discharge current in a stationary lighting operation J (A) and a cadmium pressure in a stationary lighting operation P (kPa) is in a range 0.13 to 15. Also, a projection exposure device, which has the above-described discharge lamp and a power supply for carrying out the lighting operation of the discharge lamp under the above-described condtions.

14 Claims, 5 Drawing Sheets

CADMIUM/RARE GAS DISCHARGE LAMP OF THE SHORT ARC TYPE, AS WELL AS PROJECTION EXPOSURE DEVICE USING THE SAME

BACKGROUND OF THE INVENTION

Field of the invention relates to a short arc discharge lamp in which cadmium and rare gas contribute to a radiation. The invention more particularly relates to a cadmium/rare gas discharge lamp of the short arc type which is suitable for use as the light source of optical devices and in which ultraviolet rays are used, as well as a projection exposure device suitable for semiconductor manufacture using the cadmium/rare gas discharge lamp of the short arc type.

BACKGROUND OF THE DISCLOSURE

Optical devices using ultraviolet rays are widely used for industrial applications, such as for reforming plastic surfaces, for a photo-CVD, for ashing, for UV-curing in which a specific wavelength range is required, for photolithography and similar purposes. In particular for exposure light sources of projection exposure devices, which are used in the manufacturing process of a semiconductor device, such as Ultra-LSI and the like, are desired excellent ultraviolet light sources.

When using in a wavelength range of 185 to 300 nm, conventionally a metal/rare gas discharge lamp is used, in which rare gas is enclosed. It has been asserted that when using light, particularly in a wavelength range of 200±20 nm, a cadmium/rare gas discharge lamp in which cadmium is enclosed is suitable. This procedure is described e.g. in JP-OS SHO 55-10757, which discloses that by determining the enclosed quantity of metal cadmium and rare gas an irradiance in the wavelength range 220±20 nm can be increased, which could significantly shorten the exposuring time when manufacturing a semiconductor device.

However, the use of such a lamp for industrial application is not very satisfactory. An increase in the quantity of cadmium leads to a greater self-absorption effect, even if the encapsulation quantity remains within a predetermined range. As a consequence, the radiation intensity of the lamp drops within the wavelength range necessary for action, while at the same time there is a significant increase to the irradiance in an unnecessary wavelength range, both above and below the wavelength range necessary for action.

The emission spectra of a lamp having encapsulated or enclosed cadmium is generally obtained as a result of a subtle equilibrium of the density of cadmium atoms, ions and molecules, which are in a fundamental or excitation state. In order to obtain emission spectra in a necessary wavelength range one must, by strictly determining the enclosed quantity of metal cadmium, maintain a suitable density and a suitable pressure in stationary lighting operation.

The cadmium pressure in a stationary lighting operation and the density of cadmium are also significantly influenced by the temperature of the coolest part of the quartz bulb in a lighting operation. The reason for this may possibly be that the vapor pressure of cadmium at the surface temperature of the quartz bulb in a stationary lighting operation is lower by approximately two places than that of mercury and, consequently, cadmium is easily condensed by a smaller temperature drop. It is therefore necessary to provide a temperature regulating means for a quartz bulb, such as a thermally insulating film or the like.

SUMMARY OF THE INVENTION

The first object of the invention is therefore to provide a cadmium/rare gas discharge lamp of the short arc type, which suppresses an unnecessary emission above and below the necessary emission spectra in a wavelength range of 210 to 230 nm, obtains a high intensity of the emission spectra in the range 210 to 230 nm, and which can also be used for industrial applications.

A further object of the invention is to provide a highly efficient projection exposure device by incorporating a cadmium/rare gas discharge lamp of the short arc type having good emission spectrum characteristics in the wavelength range 210 to 230 nm and which can projectingly transmit fine image patterns with a considerable depth of focus.

According to the invention, this object is achieved by a cadmium/rare gas discharge lamp of the short arc type within a temperature-regulated quartz bulb, which is provided with a pair of adjacent, facing electrodes, together with rare gas, which is preferably selected from xenon, krypton, argon or neon or a mixture thereof, in which metal cadmium with a pressure of 14 to 200 kPa is enclosed in a stationary lighting operation and the lamp is operated in such a way that J/P, i.e. the ratio between a discharge current in a stationary lighting operation J expressed in amperes (A) and a cadmium pressure in a stationary lighting operation P expressed in kiloPascals (KPa), is in a range 0.13 to 15.

It is also desirable that a further outer tube be provided outside the fluorescent tube for temperature regulation purposes, or that a protective film can be formed on an outer surface of the above-described fluorescent tube.

The projection exposure device according to the invention has an illuminating optics system for focusing the light emitted by the light source and for the homogeneous illumination of a light circle, as well as a projection optics system for projecting image patterns of the above-described light circle on a wafer.

For the above-described light source, a cadmium/rare gas discharge lamp of the short arc type is fitted into said projection exposure device. The light source comprises a temperature-regulated fluorescent tube, which is provided with a pair of adjacently facing electrodes, in which one of the rare gases xenon, krypton, argon or neon or a mixture of these rare gases is selected, and metal cadmium with a pressure of 14 to 200 kPa is encapsulated in a stationary lighting operation. The projection exposure device is also provided with a power supply through which the above-described cadmium/rare gas discharge lamp of the short arc type is operated in such a way that J/P, i.e. the ratio between a discharge current in a stationary lighting operation J (A) and a cadmium pressure in a stationary lighting operation P (kPa) is in a range 0.13 to 15.

As a result of research carried out by the inventors a mechanism has been found as a result of such an arrangement, within a wavelength range 210 to 230 nm, an emission spectrum form of around 215 nm is produced, mainly by absorption of cadmium ions in a grand state and around 222 nm mainly by absorption of cadmium atoms and molecules in a grand state. As a consequence, and that as a consequence thereof emission spectra of 210 to 230 nm are mainly obtained through the irradiation of cadmium ions and molecules.

The inventors have also found that this irradiation reacts sensitively to changes of the cadmium pressure in a stationary lighting operation and of the discharge current. As a result of a number of different types of tests the inventors have also found that if the discharge current in a stationary lighting operation is designated J (A) and the cadmium pressure in a stationary lighting operation is designated P (kPa), it is appropriate for J/P to be 0.13 to 15, as will be apparent from the subsequently described embodiments.

A lighting operation with J/P (A/kPa) less than or equal 0.13 means that the lamp is operating with a high cadmium pressure and a low discharge current. Although in this case a slope of the emission spectra may be obtained, a large amount of cadmium is present in a basic state within the quartz bulb which encloses an arc formed between the electrodes. Therefore, due to a significant self-absorption of cadmium, the luminous efficiency is acutely decreased or drops as a result of a lowering of the arc temperature and the resulting reduction in the density of the distribution number of cadmium ions. However, if J/P (A/kPa) higher than or equal 15, due to a reduction of the cadmium pressure, there is also a decrease in the emission intensity and therefore the radiant efficiency.

As described hereinbefore, using the projection exposure device according to the invention and as a result of the measure of incorporating a high-performance discharge lamp in the wavelength range of 210 to 230 nm, a number of disadvantages are eliminated, which occur in the case that an excimer laser is used for a light source in the same wavelength range, as will be described in detail hereinafter by means of embodiments. Thus, as a result of the measure according to the invention, a device is obtained having a compact shape and at the same time an extended life, and which has a projecting transmission of even finer image patterns for a considerable depth of focus.

BRIEF DESCRIPTION OF THE DRAWINGS

The invention is described in greater detail hereinafter with reference to the drawings, which show.

DETAILED DESCRIPTION

Figure 1:
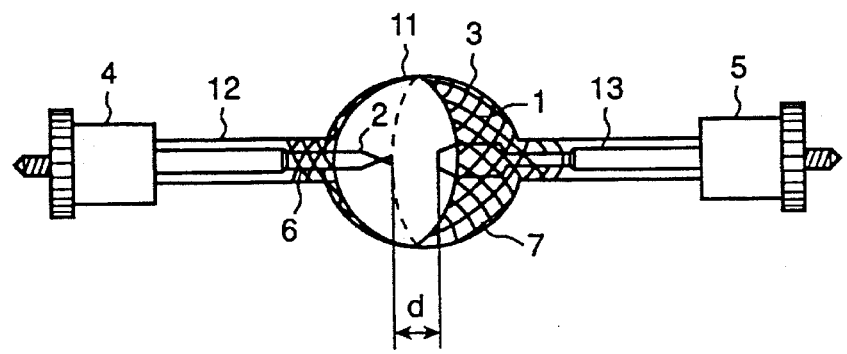
FIG. 1 A diagrammatic representation of a short arc-type cadmium/rare gas discharge lamp according to the invention.

FIG. 1 shows a specific arrangement of the cadmium/rare gas discharge lamp of the short arc type according to the invention with a rated capacity of 1 kW in a stationary lighting operation.

FIG. 1 shows a short arc-type cadmium/rare gas discharge lamp according to the invention, in which a quartz fluorescent tube is designated by the reference numeral 1. The quartz bulb 1 has in the center an enclosed, oval envelope 11, on whose two ends are formed hermetically sealed portions 12 and 13.

With the enclosed emission chamber 11 are provided a cathode 2 and an anode 3 with a spacing d of approximately 2 to 6 nm and adjacently face one another. The ends of the hermetically enclosed parts 12 and 13 are provided with bases 4 and 5 and on the sides where the cathode 2 and the anode 3 extend from the enclosed emission chamber 11, there are thermal insulation films 6 and 7 for maintaining a vapor pressure within a certain minimum level, said films being constructed in such a way that the exit of the radiation light is not prevented.

The thermal insulation films by means of which the temperature of the quartz bulb 1 are regulated are, e. g., made from a silicon resin as the main component and a metal oxide-containing material. Through the action of the thermal insulation film the temperature of the outer surface of the quartz bulb can be stabilized at a high temperature of approximately 850±80° C., whereas e. g. without the thermal insulation films the temperature of the tube outer surface would vary within a range of approximately 650±100° C.

It is possible to use a double tube construction as the temperature regulating means for the outer surface of the quartz bulb, in which an outer bulb is placed around the quartz bulb 1. However, it is also possible to use the temperature regulating means with other constructions, provided that the temperature can be regulated.

The temperature regulation is provided, in the matter described hereinbefore, so as to keep the temperature changes of the coolest part of the quartz bulb within a permitted range, so that the density of the cadmium atoms, ions and molecules in the ground state and in the excitation state, as well as the cadmium pressure in stationary lighting operation, can be appropriately maintained.

The lamp according to one embodiment of the invention is a so-called short arc lamp with a spacing d between the electrodes of approximately 2 to 6 mm. The reason for a very short arc length is that on fitting the lamp within an optical system the focussing efficiency of a focussing mirror is increased and an effective radiation quantity can be obtained.

Figure 2:
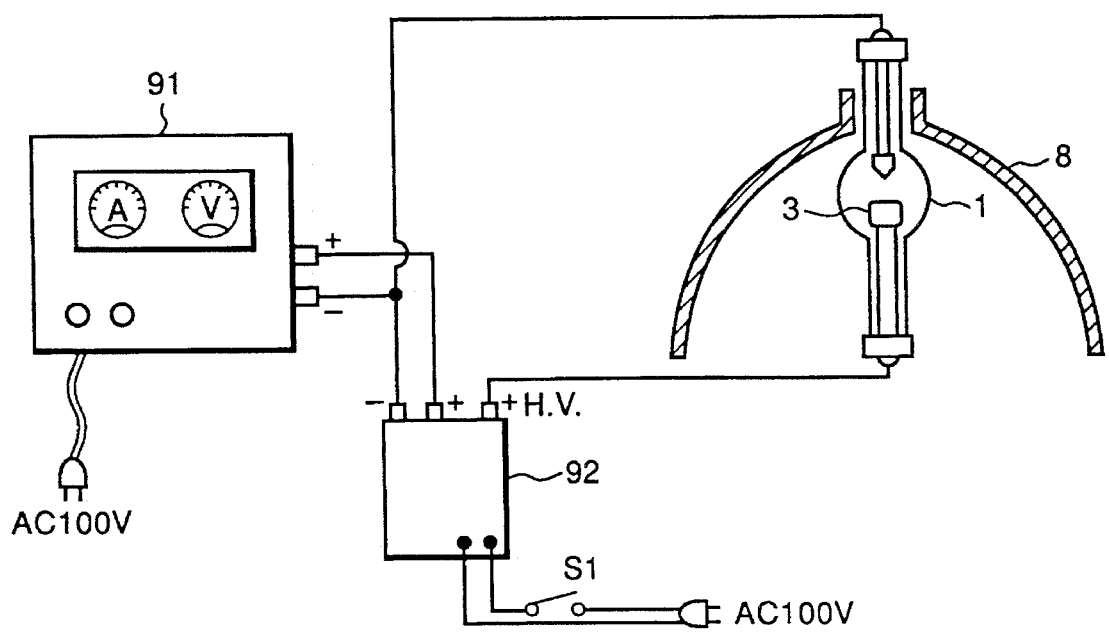
FIG. 2 A block diagram of a circuit appropriately used for the lighting operation of the short arc-type cadmium/rare gas discharge lamp according to the invention.

FIG. 2 is a block diagram of a circuit, which may be appropriately used as the power supply for a short arc-type cadmium/rare gas discharge lamp according to the invention. This circuit comprises a constant power supply 91 and a starter 92.

In the case of the short arc-type cadmium/rare gas discharge lamp 1, which is inserted in a focussing mirror 8, the output is connected from the constant power supply 91 across the starter 92. By closing a switch 81 of the starter 92 a high voltage is produced in the latter and by applying the voltage to the anode 3 of the short arc-type cadmium/rare gas discharge lamp 1 a destruction of the lamp discharge is obtained. Then, through the supply of the current from the constant power supply 91, an uninterrupted arc discharge is maintained. By regulating the output current from the constant power supply 91, it is possible to obtain a stable arc discharge and consequently stabilize the light output.

As an example, this lamp may be operated with a rated voltage of 30 V and a power rating of 2.4 kW, and on putting the lamp into operation the starter 92 applies a high voltage of approximately 5 kV.

Within the enclosed emission chamber 11, metal cadmium is enclosed together with the rare gas, which is preferably chosen from among xenon, krypton, argon, neon, or mixtures thereof. The metal cadmium is enclosed in the chamber in a quantity that produces a pressure in a stationary lighting operation of 14 to 200 kPa. With enclosing this quantity of metal cadmium, as described above, by determining the enclosed quantity in view of the ratio between a cadmium pressure (vapor pressure) in a stationary lighting operation and a discharge current, an approximately acute-angled shape of the emission spectra in a wavelength range 210 to 230 nm, and more specifically in a wavelength range 214 to 224 nm, is made possible and obtained with a high intensity.

Cadmium when encapsulated in a quartz bulb is referred to as "metal cadmium" due to its solid state, whereas cadmium in a stationary lighting operation is only referred to as "cadmium" because it is present as a vapor (gas).

In order to check the ratio between the form of the emission spectra and the cadmium pressure in a stationary lighting operation, a plurality of discharge lamps were tested in which within a quartz bulb, rare gas, selected from among kenon, krypton, argon, neon or a mixture of these rare gases, as well as cadmium are encapsulated, while using a constant power supply operated by a direct current discharge. The spacing between the electrodes in the above-mentioned discharge lamps was 5 mm. FIGS. 3 to 6 give the results.

The term "stationary lighting operation" is understood to mean a state in which, after putting the lamp into operation by means of a starter, normally approximately 5 minutes later, the discharge voltage has reached a stationary state.

Figure 3:
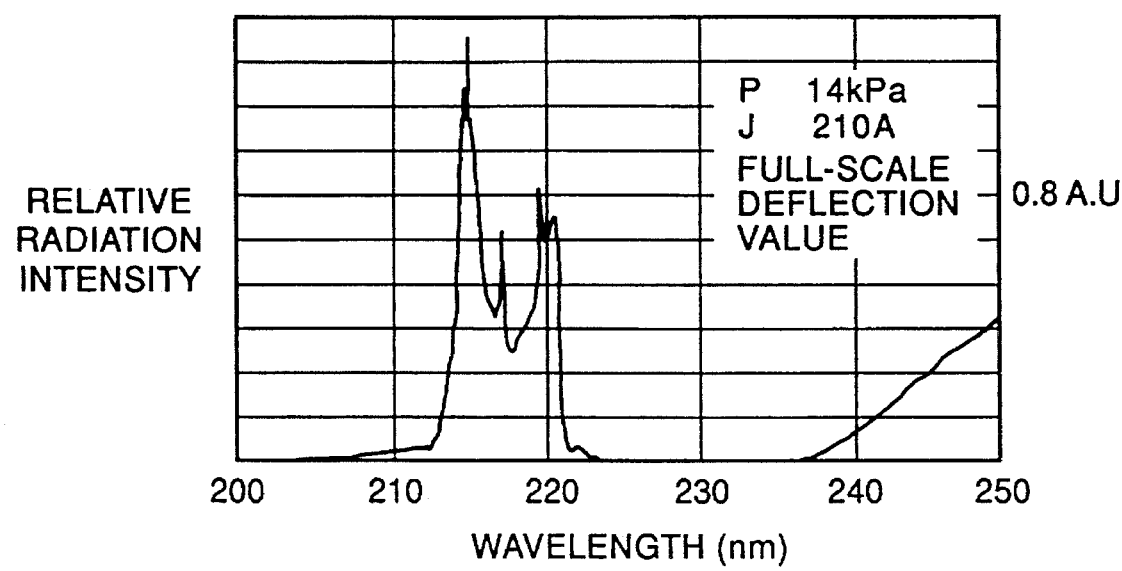
FIG. 3 Radiation spectra with wavelengths from 200 to 250 nm with a cadmium pressure in a stationary lighting operation of 14 kPa and a lighting current of 210 A.

FIG. 3 shows emission spectra with wavelengths of 200 to 250 nm with a cadmium pressure in a stationary of 14 kPa and a discharge current of 210 A.

Figure 4:
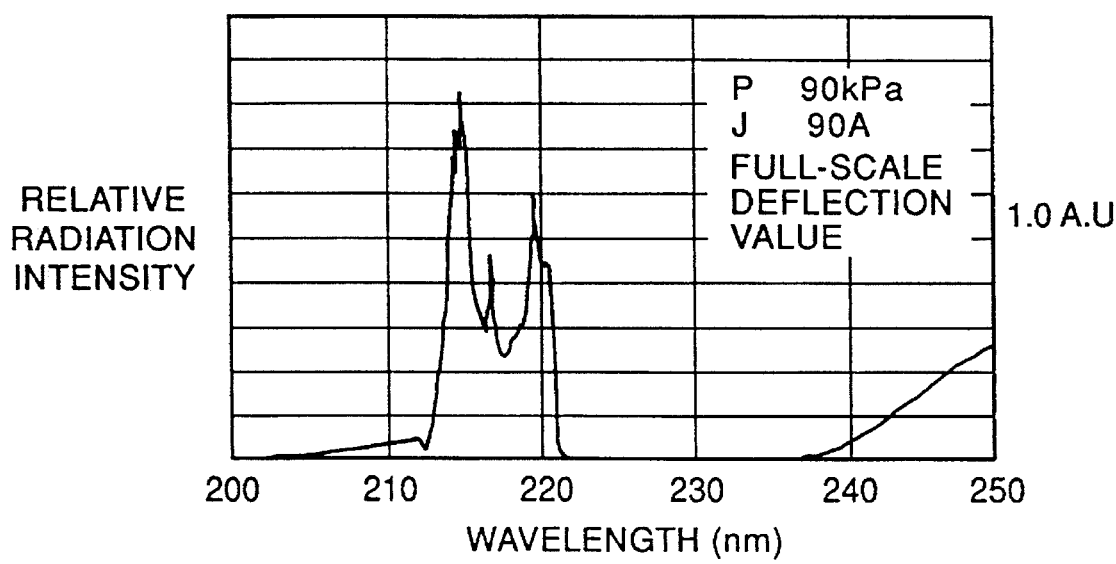
FIG. 4 Radiation spectra with wavelengths from 200 to 250 nm with a cadmium pressure in a stationary lighting operation of 90 kPa and lighting current of 90 A.

FIG. 4 shows emission spectra with wavelengths of 200 to 250 nm with a cadmium pressure in a stationary lighting operation of 90 kPa and as discharge current of 90 A.

Figure 5:
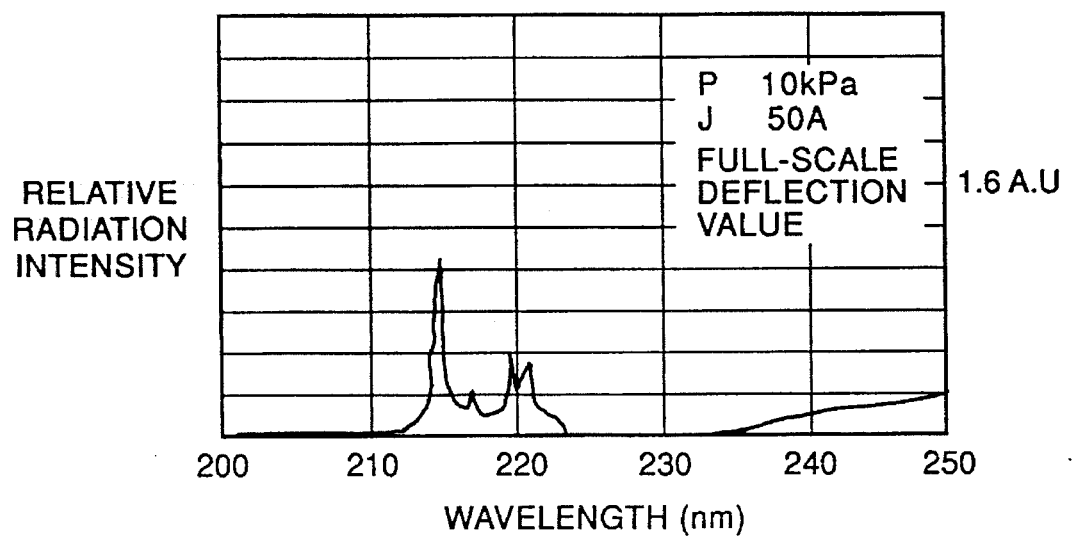
FIG. 5 Radiation spectra with wavelengths of 200 to 250 nm with a cadmium pressure in a stationary lighting operation of 10 kPa and a lighting current of 50 A.

FIG. 5 shows emission spectra with wavelengths of 200 to 250 nm with a cadmium pressure in a stationary of 10 kPa and a discharge current of 50 A.

Figure 6:
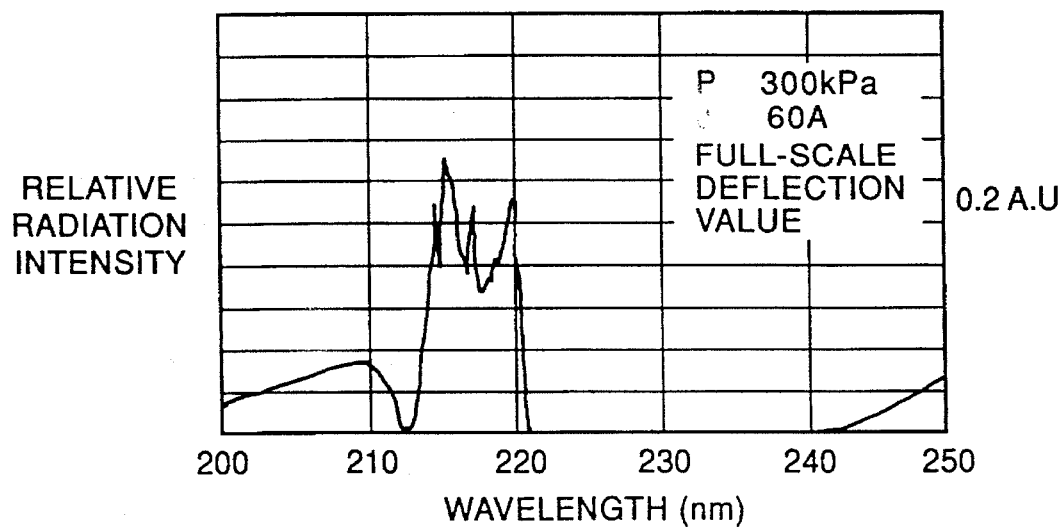
FIG. 6 Radiation spectra with wavelengths of 200 to 250 nm with a cadmium pressure in a stationary lighting operation of 300 kPa and a lighting current of 60 A.

FIG. 6 shows emission spectra with wavelengths of 200 to 250 nm with a cadmium pressure in a stationary lighting operation of 300 kPa and a discharge current of 60 A.

The ordinate axis in FIGS. 3 to 6 shows a relative radiation intensity, in which each full-scale deflection is shown in such a way that according to FIG. 3 it has a value of 0.8, according to FIG. 5 a value of 1.6, and according to FIG. 6 a value of 0.2 on setting a value of 1.0 in FIG. 4. Through a conversion of the full-scale deflection values it is evident that the radiation intensity in FIG. 4 is higher than in FIG. 3, even if an inverse impression results from a visual comparison between FIG. 3 and FIG. 4.

The above-described test show that the emission spectra within a wavelength range of 210 to 230 nm, more specifically 214 to 224 nm, have an approximately acute-angled shape, provided that the encapsulated cadmium quantity has a pressure in the range from about 14 to about 200 kPa in a stationary lighting operation.

The term "approximately acute-angled shape" means that in a necessary wavelength range, a high intensity and therefore a high luminous efficiency occurs and at the same time the spectral irradiance can be suppressed in an unnecessary wavelength range above and below the necessary wavelength range.

In the case where the enclosed metal cadmium quantity corresponds to a pressure of 10 kPa in a stationary lighting operation, as shown in FIG. 5, the spectral radiance in a wavelength range 210 to 230 nm is attenuated and is then lost. The acute-angled shape then largely disappears. The above-described phenomenon appears to be caused by changes to the density of the cadmium atoms, ions and molecules produced by an arc, a Stark broadening and a resonant broadening. However, the specific cause of the phenomenon has not as yet been determined.

However, if the metal cadmium is encapsulated in such a way that the pressure in a stationary lighting operation is 300 kPa, as shown in FIG. 6, the radiation intensity in a wavelength range 210 to 224 nm is extremely weak due to a self-absorption of the cadmium. The width of the acute-angled shape also becomes somewhat less.

The above-described test was performed with a cadmium pressure in a stationary lighting operation 300 kPa. However, if the cadmium pressure in a stationary lighting operation is greater than or equal 200 kPa, the temperature of the coolest part of the quartz bulb rises to above 1000° C. In this case, there is a risk of the lamp shattering after a lighting period of a few hundred hours, because the temperature of the hottest part of the quartz bulb is roughly at the softening point of quartz glass. It is therefore desirable to use the lamp with a cadmium pressure in stationary lighting operation of equal to or below about 200 kPa.

The different types and the encapsulation pressure of the rare gas have no great influence on the emission spectra within 210 to 230 nm. Thus, no special determination thereof is necessary and, taking account of a reduction of the starting voltage and the like, a rare gas pressure of approximately 50 kPa to 2 MPa (2000 kPa) is suitable.

The emission spectra in FIGS. 3 and 4 have a weak radiation intensity in a wavelength range of 224 to 230 nm, but an approximately acute-angled shape of the emission spectra in a range of approximately 214 to 224 nm. Although it has been stated that the object of the invention is to obtain an acute-angled shape of the emission spectra in a wavelength range of 210 to 230 nm, it is adequate to obtain an acute-angled shape of the emission spectra in a wavelength range of approximately 214 to 224 nm, because the wavelength range 210 to 230 nm, taking account of errors and the like, has been fixed somewhat wider and the irradiation by cadmium ions or molecules occurs in a wavelength range of approximately 214 to 224 nm.

As a result of the above described measure, although a spectrum shape in a desired wavelength range can be obtained the light source does not appear adequately usable for industrial purposes, because not only the determination of an encapsulation quantity of the metal cadmium with respect to the pressure in a stationary lighting operation plays an important role, but apart from the cadmium pressure in a stationary lighting operation the ratio between the cadmium pressure in the stationary lighting operation and the discharge current, too. For this reason, use was made of nine lamps as test objects and each underwent a shape suitability test with respect to emission spectra under different lighting conditions.

Table 1 illustrates the relations between the cadmium pressure in a stationary lighting operation P (kPa), the discharge current in the stationary lighting operation J (A), the ratio between P and J (J/P), the slope R, the radiant efficiency $\eta$, and the shape suitability of the emission spectra.

The slope or gradient R designates a numerical value, which is defined as $\delta\lambda_{(1/2)}/\delta\lambda_{(1/10)}$, where the half-intensity width of the peak value of the radiation intensity is designated $\delta\lambda_{(1/2)}$ and the 1/10 width of the peak value is designated $\delta\lambda_{(1/10)}$. The half-intensity width is a wavelength, which has a half-value of the maximum value of the radiation intensity and therefore designates a difference between the wavelength with a half-value of the maximum value with a reduction of the emission spectra with an acute-angled shape and the wavelength with a half-value of the maximum value when a rise occurs. The 1/10 width of the peak value also means a difference between the wavelength, which has 1/10 of the maximum value with a drop in the emission spectra, and the wavelength having 1/10 of the maximum value with a rise.

The radiant efficiency η designates a numerical value, which is defined by the ratio between a total irradiation of the spectra within a wavelength range 210 to 230 nm due to the emission spectrum shape in FIG. 3 over the entire solid angle and an input power.

The suitability evaluation is represented in such a way that the cases in which R>0.7 and η>0.8 are designated as acceptable with O and other cases are designated unacceptable with X.

TABLE 1

|   | P(kPa) | J(A) | J/P (A/kPa) | R | η(%) | Suitability |
|---|---|---|---|---|---|---|
| 1 | 10 | 50 | 5.0 | 0.1 | 0.7 | X |
| 2 | 14 | 14 | 1.0 | 0.9 | 1.0 | O |
| 3 | 14 | 210 | 15.0 | 0.8 | 0.9 | O |
| 4 | 14 | 280 | 20.0 | 0.4 | 0.5 | X |
| 5 | 90 | 7.2 | 0.08 | 0.9 | 0.4 | X |
| 6 | 90 | 18 | 0.2 | 0.9 | 1.0 | O |
| 7 | 90 | 90 | 1.0 | 0.85 | 1.1 | O |
| 8 | 300 | 60 | 0.2 | 0.9 | 0.2 | X |
| 9 | 300 | 150 | 0.5 | 0.9 | 0.1 | X |

As is illustrated in Table 1, the lamps 2, 3, 6 and 7, in which J/P is in each case in a range 0.13 to 15 (a/kPa) are evaluated as acceptable O because of desired results. The lamp 1, in which the J/P is also in this range, but where the metal cadmium is enclosed in a small quantity, is not suitable in view of the slope R. Moreover, the lamps 8 and 9, in which a large amount of metal cadmium is enclosed, are unsuitable in view of the radiant efficiency η and therefore evaluated unacceptable X.

This makes it clear that for obtaining a satisfactory slope R and radiant efficiency η the cadmium pressure in a stationary lighting operation must be at 14 to 200 kPa and the ratio between the discharge current J and the encapsulation pressure of the cadmium P in the stationary lighting operation, i.e. J/P (A/Pa) must be chosen within a range 0.13 to 15.

Figure 7:
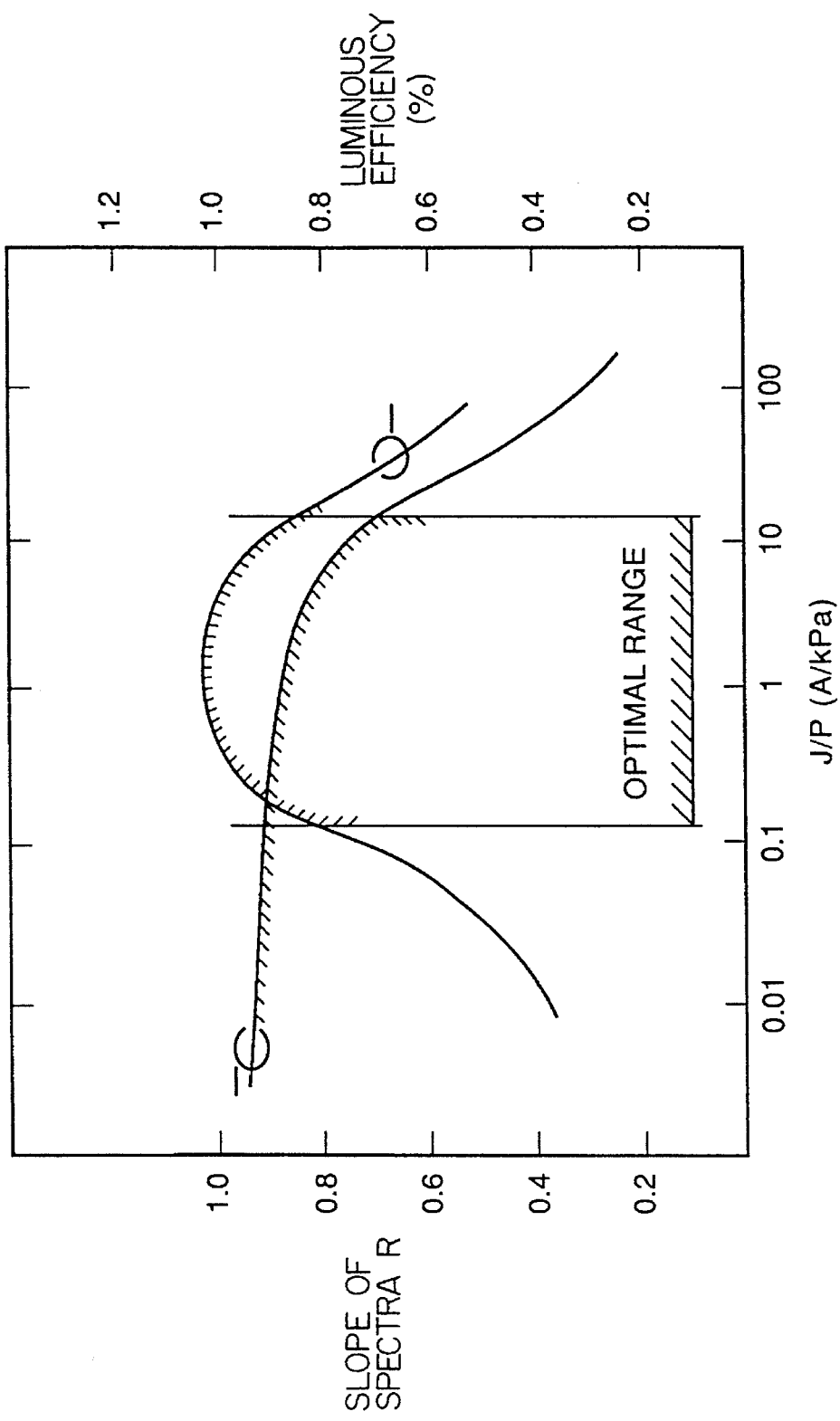
FIG. 7 A diagrammatic representation reproducing the relationship between a J/P, i. e. the ratio between a discharge current J and a cadmium pressure in a stationary lighting operation P, a slope or gradient of the radiation spectra R and a radiant efficiency η.

FIG. 7 gives a generalized state of the relation between J/P, i.e. the ratio between the discharge current J and the encapsulation pressure of the metal cadmium P, the slope R of the emission spectra and the radiant efficiency η. The slope R of the emission spectra acutely drops, as illustrated in FIG. 7, if the J/P is higher than or equal to 15 A/kPa. However, if the J/P is less than or equal to 0.13 A/kPa the radiant efficiencyμ acutely decreases, although the slope R of the spectra approaches 1. Thus, there is an optimum range of J/P with regard to the slope R of the spectra and the radiant efficiency η at equal to or greater than about 0.13 and equal to or less than about 15 A/kPa.

Without intent to limit the scope of the invention, it is suggested that the reason why at a J/P of less than or equal to about 15 A/kPa the emission spectra have a desirable slope or gradient may be that by increasing the cadmium pressure there is a self-absorption of cadmium resonance lines, or by decreasing the discharge current there is a suitable production of cadmium ions and consequently a self-absorption. Also, the reason why the radiant efficiency acutely drops at a J/P of less than or equal to 0.13 A/kPa may be due to the fact that there is a large cadmium quantity around the arc formed between the electrodes and consequently a significant absorption by resonance lines in a short-wave range.

Figure 8:
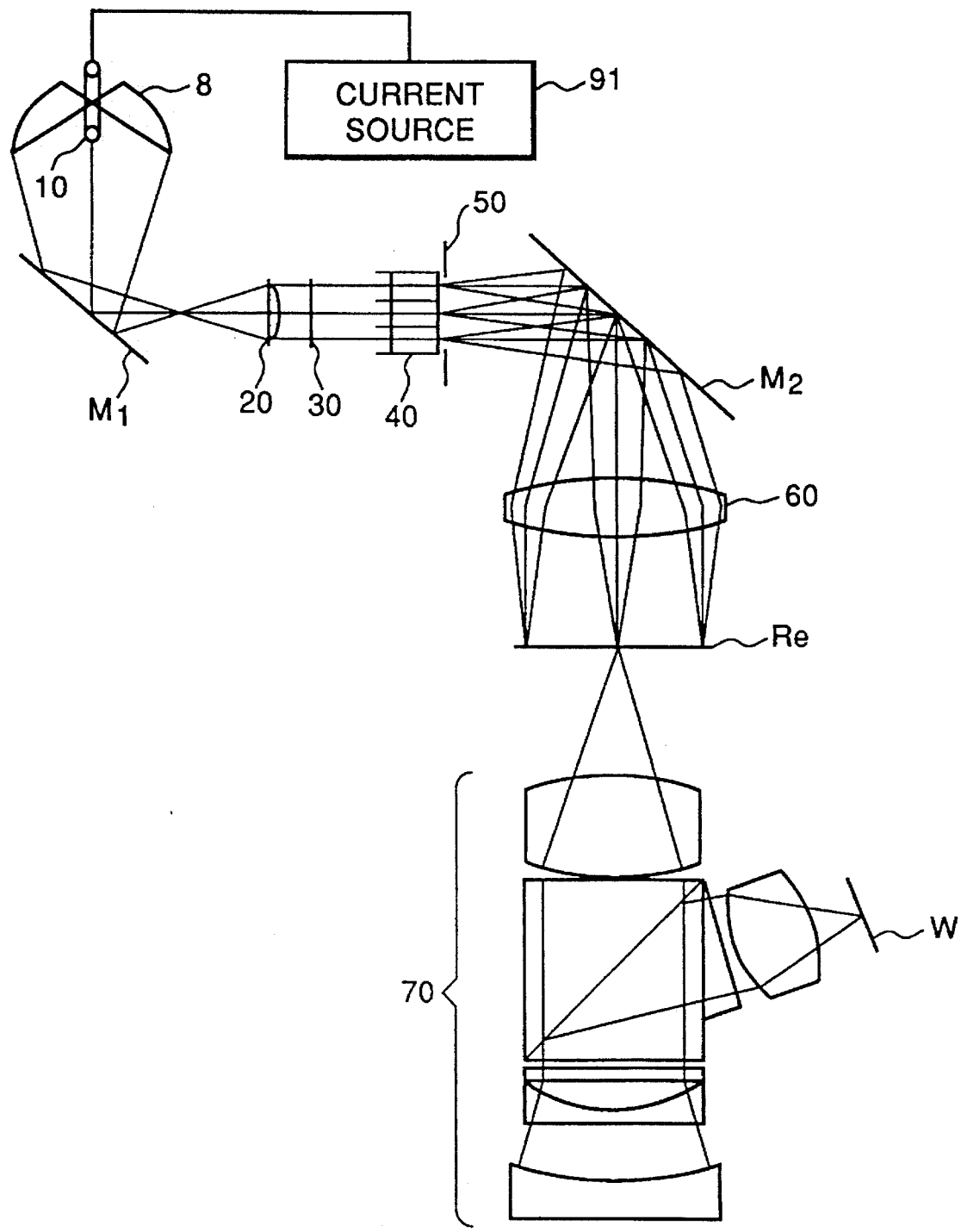
FIG. 8 A diagrammatic representation of the arrangement of the projection exposure device according to the invention.

FIG. 8 diagrammatically shows an arrangement of the projection exposure apparatus according to the invention. The cadmium/rare gas discharge lamp of the short arc type 10 according to the invention and which has a light emission at least in a wavelength range 210 to 230 nm is located in the first focal position of an oval mirror 8, as shown in FIG. 8. The light flux emitted by the discharge lamp 10 enters a collimating lens 20 following focussing on the second focal position of the oval mirror 8 by means of a reflection and focussing action of said mirror 8 via a reflecting mirror $M_1$.

The light flux, which has passed through the collimating lens 20, after conversion into substantially parallel light fluxes, passes through a wavelength selection filter 30, which within the wavelength range 210 to 230 nm selectively extracts light with a desired wavelength for exposure purposes and then passes through a fly-eye lens 40 formed from lens elements.

From an exit side of the fly-eye lens 40 are formed light source images and a secondary light source is formed substantially as a planar light source and on which is located an aperture stop 50 provided with a given aperture for the precise determination of the size of the secondary light source. The light fluxes from each light source forming the secondary light source, after a reflecting by mirror $M_2$, are each condensed by means of a condenser lens 60 and uniformly illuminate a reticle Re.

Everything from the oval mirror B to the condenser lens 60 forms a illuminating optical system for illuminating the reticle Re. A lens system (20, 40, 60) is made from an optical material with an adequate transmittance in the wavelength range 210 to 230 nm, such as synthetic fused silica ($SiO_2$) or calcium fluoride ($CaF_2$).

Below the reticle Re is provided a reduction projection optical system of reflection refraction type 70, which is made from an optical material such as synthetic fused silica ($SiO_2$), calcium fluoride ($CaF_2$) or the like. The circuit patterns formed on the reticle Re are projected onto a wafer W.

The reduction projection optical system 70 shown in FIG. 8 is a known system and as disclosed by JP-OS HEI 3-282527, is a reduction reflection optical system with reflectors. However, it is also possible to merely use a projection optical system comprising a refraction optical system without a reflection surface, if such a projection optics system permits an advantageous (good) imaging in the wavelength range 210 to 230 nm.

In the case of the projection exposure apparatus with the above-described arrangement the cadmium/inert gas discharge lamp of the short arc type 10 has an arrangement shown e.g. in FIG. 1 and is operated by the power supply 91 with an arrangement of the type shown in FIG. 2 so that J/P, i. e. the ratio between an impressed current in a stationary lighting operation J and a cadmium pressure in the stationary lighting operation P is in a range 0.13 to 15 A/kPa.

As a result of such a projection exposure apparatus the circuit patterns formed on the reticle can be projected by means of a projection optical system in reduction manner onto the wafer, so that even finer image patterns can be projected on the wafer and consequently it is possible to manufacture semiconductor devices formed of ultrafine patterns, such as LSI, ultra LSI, etc., in a simple manner.

It is generally known that in a projection optical system of a projection exposure apparatus it is possible to calculate an image resolution r and a depth of focus DOF in accordance with the following formulas, if in the projection optical system a numerical aperature is designated NA and an exposure wavelength $\lambda$:

$$r = k_1 \lambda / NA_2$$

$$DOF = k_2 k \lambda / NA$$

$k_1$ und $k_2$ standing for coefficients (process factors), which are determined on the basis of manufacturing processes.

As is apparent from the above formulas it is aimed at reducing the exposure wavelength $\lambda$ in order to adequately maintain the depth of focus DOF of the projection optical system and at the same time significantly improve the image resolution of the projection optical system.

For this purpose a projection exposure apparatus has recently been developed, in which a krypton fluoride (KrF) excimer laser, emitting light with a wavelength of 248 nm, is used as the exposure light source. Of late further projection exposure apparatuses have been developed using an argon fluoride (ArF) excimer laser as the exposure light source, which emits light with a wavelength of 193 nm, or projection exposure aparatuses in which use is made of higher harmonics of a solid state laser as the exposure light source.

However, on increasing the exposure power with excimer laser or the higher harmonic light from the solid-state laser, there is a risk that optical material is damaged because of higher pulse energy. This has made it clear that it is very advantageous to use a stationary emission source in the form of the discharge lamp according to the invention.

The frequency of the above-described excimer laser or solid state laser is max at approximately 500 Hz to 2 KHz. There was therefore a need for a significant increase in the light energy per pulse, in order to ensure the necessary illumination on a wafer surface.

On the passage of a deep ultraviolet radiation with a high power density and a wavelength equal to or smaller than 248 nm as the exposure light through a projection optical system made of synthetic quartz ($SiO_2$) or calcium fluoride ($CaF_2$), as a result of a 2-photon absorption there was a considerable deterioration of the optical characteristics in particular of the synthetic fused silica ($SiO_2$), such as transmittance and the like.

In order to confirm the above-described disadvantage in a specific manner the inventors carried out a test in which synthetic fused silica ($SiO_2$) was irradiated with argon fluoride (ArF) excimer laser light at 10 mJ/cm$^2$. It was found that use as an optical system was no longer possible due to a significant deterioration of the optical characteristics at approximately $10^8$ pulse and that the projection optical system did not have an adequate life.

To eliminate the deterioration of the optical characteristics of the optical material it is necessary to increase the pulse frequency and reduce the energy per pulse. For this purpose it is ideal and desired to have a continuous emission on the basis of an infinite frequency. However, it is difficult to increase the frequency in the case of an excimer laser, and a continuous emission is impossible for an excimer laser because the emission puls duration is approximately 15 to 20 ns, max approximately 100 ns. In addition, on increasing the emission pulse duration, there is the problem that unnecessary interference fringes occur due to a rise in the spatial coherence.

In the case of the above-described projection exposure apparatus using the cadmium/inert gas discharge lamp of the short arc type according to the invention, through the use of a continuous emission source it is not necessary to emit light with an extremely high power density. Therefore a good image formation efficiency can be maintained for a long time without any risk of degenerating the optical material, such as synthetic fused silica ($SiO_2$) and the like.

If an excimer laser is used as the light source for a projection exposure apparatus, it is necessary to have almost twice the foot print compared with a projection exposure apparatus using a conventional mercury arc lamp and the projection exposure apparatus becomes larger, because an excimer laser per se has an excessive size. In addition, considerable time, labor and costs are required for maintaining an excimer laser as the exposure light source.

The projection exposure apparatus according to the invention completely eliminates the above-described disadvantages. Thus, according to the invention, it is possible to obtain a more compact equipment and also a longer life than a conventional apparatus and to project finer image patterns onto a wafer with maintaining a large depth of focus.

As described hereinbefore, as a result of use of the invention, in which metal cadmium is enclosed in an amount such that the pressure in a stationary lighting operation is 14 to 200 kPa, an acute-angled shape of the emission spectra is obtained within a wavelength range of 210 to 230 nm.

Furthermore, as a result of the use of the invention, in which within said cadmium pressure range the ratio between the discharge current J and the cadmium pressure in a stationary lighting operation P (J/P) is set at 0.13 to 15 A/kPa, an unnecessary emission in a wavelength range above and below of the wavelength range 210 to 230 nm is largely suppressed and at the same time the emission in the wavelength range 210 to 230 nm is increased.

Therefore, the arc-type cadmium/rare gas discharge lamp according to the invention, preferably a short arc lamp, can be used for light sources of optical devices where ultraviolet rays are used, such as devices for photo-ashing, the hardening or curing of ink or resin, for photolithography and other purposes and may take place in an optimum manner.

A further utilization of the invention is as apparatus in the form of a projection exposure apparatus which has an even higher image resolution than a conventional projection exposure apparatus and which at the same time ensures an adequate depth of focus. Moreover, as a result of the teachings according to the invention a projection exposure device can be obtained, which has a more compact size and a considerably increased life compared with the use of an excimer laser as the light source, whilst at the same time permitting very easy maintenance.

In addition to the above it is noted that the indicated upper and lower limits of the ratio J/P are approximate. With regard to the upper limit for cadmium pressure it is noted that this limit is important only for durability purposes.

It is to be understood that although preferred embodiments of the invention have been described, various other embodiments and variations may occur to those skilled in the art. Any such other embodiments and variations which fall within the scope and spirit of the present invention are intended to be covered by the following claims.

What we claim is:

1. An arc-type cadmium/rare gas discharge lamp comprising a temperature-regulated quartz tube for use in a stationary lighting operation, said tube comprising a pair of electrodes, together with a rare gas selected from the group consisting of xenon, krypton, argon, neon, and mixtures thereof, and metal cadmium enclosed with a cadmium pressure (P) of at least 14 kPa in a stationary lighting operation, wherein the lamp is operable at a discharge current (J), such that J/P is in a range of 0.13 to 15 amperes/kiloPascals.

2. A discharge lamp according to claim 1 in which the cadmium pressure is in a range of 14 to 200 kPa.

3. A discharge lamp according to claim 1 further comprising a thermal insulation film formed on a surface of the discharge lamp for temperature regulation purposes.

4. A discharge lamp according to claim 3 in which the thermal insulation film comprises a silicon resin and a metaloxide component.

5. A discharge lamp according to claim 1 in which the electrodes are adjacently facing each other.

6. A cadmium/rare gas discharge lamp according to claim 1 in which the lamp is of the short arc type.

7. An arc type cadmium/rare gas discharge lamp according to claim 1 in which the arc distance is between 2 and 6 nm.

8. An arc-type cadmium/rare gas discharge lamp according to claim 1 further comprising a focussing mirror.

9. An arc-type cadmium/rare gas discharge lamp according to claim 1 further comprising a starter.

10. An arc-type cadmium/rare gas discharge lamp according to claim 1 wherein the rare gas pressure is in the range of about 50 kPa to about 2000 kPa.

11. An arc-type cadmium/rare gas discharge lamp according to claim 1 wherein the tube is quartz.

12. An arc-type cadmium/rare gas discharge lamp according to claim 1 wherein the operating temperature is between 700° C. and 1000° C.

13. An arc-type cadmium/rare gas discharge lamp according to claim 1 wherein the operating temperature is between 770° C. and 930° C.

14. Projection exposure apparatus comprising:

a light source;

an illuminating optical system for collecting light emitted from said light source and for illuminating a reticle homogeneously; and a projection optical system for projecting a predetermined pattern of the reticle onto a wafer;

wherein said light source includes a power supply and a cadmium/rare gas discharge lamp of the short arc-type operated by said power supply, said cadmium/rare gas discharge lamp having a temperature-regulated bulb provided with a pair of electrodes, rare gas selected from the group consisting of xenon, krypton, argon, neon and mixtures thereof in the bulb and metal cadmium encapsulated in the bulb having a pressure of 14 to 200 kPa in a stationary lighting operation, the power supply providing a stationary lighting operation in such a way that the ratio between discharge current in a stationary lighting operation J(A) and cadmium pressure in a stationary lighting operation P(kPa), (J/P), is in a range 0.13 to 15.

* * * * *